United States Patent
Heinz et al.

(10) Patent No.: US 6,820,798 B1
(45) Date of Patent: Nov. 23, 2004

(54) METHOD FOR PRODUCING CIRCUIT ARRANGMENTS

(75) Inventors: Helmut Heinz, Ansbach (DE); Bernhard Schuch, Neusitz (DE)

(73) Assignee: Conti Temic microelectronic GmbH, Nuernberg (DE)

(*) Notice: Subject to any disclaimer, the term of this patent is extended or adjusted under 35 U.S.C. 154(b) by 0 days.

(21) Appl. No.: 09/914,932

(22) PCT Filed: Mar. 1, 2000

(86) PCT No.: PCT/EP00/01770
§ 371 (c)(1),
(2), (4) Date: Oct. 29, 2001

(87) PCT Pub. No.: WO00/52974
PCT Pub. Date: Sep. 8, 2000

(30) Foreign Application Priority Data

Mar. 4, 1999 (DE) .......................... 199 09 505

(51) Int. Cl.⁷ .......................... B23K 35/12; B23K 31/02
(52) U.S. Cl. .................. 228/254; 228/180.21; 228/256; 29/834; 29/840; 257/698; 257/706
(58) Field of Search ................................ 228/254, 256, 228/122.1, 124.5, 125, 180.21; 29/834, 840, 843; 257/698, 706

(56) References Cited

U.S. PATENT DOCUMENTS

| | | | | |
|---|---|---|---|---|
| 4,493,856 A | * | 1/1985 | Kumar et al. ................ | 427/560 |
| 4,700,473 A | * | 10/1987 | Freyman et al. .............. | 29/846 |
| 4,991,359 A | | 2/1991 | Ogitani | |
| 5,275,330 A | * | 1/1994 | Isaacs et al. ........... | 228/180.21 |
| 5,407,864 A | * | 4/1995 | Kim ............................. | 29/834 |
| 5,578,869 A | * | 11/1996 | Hoffman et al. | |
| 5,842,275 A | | 12/1998 | McMillan, II et al. | |
| 6,190,941 B1 | * | 2/2001 | Heinz et al. ................. | 438/106 |
| 6,400,573 B1 | * | 6/2002 | Mowatt et al. ............. | 361/719 |
| 6,433,419 B2 | * | 8/2002 | Khandros et al. ........... | 257/698 |
| 6,611,055 B1 | * | 8/2003 | Hashemi ..................... | 257/706 |
| 2004/0124002 A1 | * | 7/2004 | Mazzochette et al. ...... | 174/252 |

FOREIGN PATENT DOCUMENTS

| | | |
|---|---|---|
| DE | 2400665 | 7/1975 |
| DE | 3514093 | 10/1986 |
| DE | 19842590 | 4/2000 |
| GB | 2224961 | 5/1990 |
| GB | 2304999 | 3/1997 |
| JP | 03152993 | 6/1991 |
| JP | 07221447 | 8/1995 |
| JP | 10270590 | 10/1998 |
| JP | 10326847 | 12/1998 |
| WO | WO86/06243 | 10/1986 |

* cited by examiner

*Primary Examiner*—L. Edmondson
(74) *Attorney, Agent, or Firm*—W. F. Fasse; W. G. Fasse

(57) ABSTRACT

The aim of the invention is to simplify and improve the production method for circuit arrangements that are mounted on a support element (5), said element having thermal through-platings (7) which are at least partially scaled by a screen printing process. To this end, the screen printing process is carried out after the application of a first metallization layer (6) to the support element (5) which forms the base metallization layer, whereby the residue of the screen printing material (8) remaining on the underside (13) of the support element (5) is stripped once the screen printing material (8) has been cured, using at least a mechanical cleaning process and/or a chemical cleaning process.

11 Claims, 1 Drawing Sheet

METHOD FOR PRODUCING CIRCUIT ARRANGMENTS

FIELD OF THE INVENTION

Printed circuit boards are produced with circuit components on the top surface of a carrier body or printed circuit board and with thermal lead-through contacts leading to the back side of the board.

BACKGROUND INFORMATION

In many use applications in electronics, circuit arrangements are used with circuit components which, in operation, generate a high dissipation loss, particularly in circuit arrangements with power components such as power modules for controlling of subassemblies. The structural components of the circuit arrangement are secured on a suitable carrier body. For example, in automotive electronics frequently surface mountable power components are used which rest with their back connector surfaces on a printed circuit board forming the carrier body. In order to assure a sufficient heat removal of the dissipation loss of the structural components, particularly the dissipation loss of structural power components, it is possible on the one hand to facilitate the vertical heat transport in the carrier body by thermal through contacts or so-called thermal vias introduced into the carrier body, i.e. lead-through contacts passing from the front side to the back side of the carrier body. As a rule, for this purpose lead-throughs are formed in the carrier body directly under the back side connector surface or support surface of the structural components, particularly the power components. These lead-throughs are metallized on their entire surface and throughout, for example by means of a copper coating. On the other hand, to achieve an external heat removal the carrier body can be secured on a metallic cooling body, for example an aluminum plate, whereby the cooling body can conduct the dissipation loss to a cooling system and the cooling body is separated from the carrier body by an electrically insulating layer, for example an insulation film.

After the securing of the structural components on the top surface of the carrier plate, namely the attachment surface, the components are contacted with connector pads and/or with conductors of a printed circuit structure by a soldering process, whereby soldering paste is printed onto the connector pads and onto the surface of the thermal "vias". Then the soldering paste is melted in a reflow soldering process. Thereby solder or solder spatter or also melted portions of the printed circuit structure can be pulled by capillary effects through the thermal vias to the underside of the carrier body, whereby the electrical isolation layer can be damaged. For example, an insulation film secured to the underside of the carrier body may be pierced whereby electrical short-circuits may be caused to the metallic cooling body or to a housing enclosing the carrier body and the circuit arrangement.

German Patent Application DE 198 42 590 which is not a prior publication, describes a method for producing of circuit arrangements in which prior to the soldering process, i.e. prior to the attachment of the structural components to the printed circuit board, all lead-through contacts or thermal vias provided in the carrier body are closed by a screen printing. The screen printing is applied to the backside or underside of the carrier body opposite the upper side or component carrying side of the carrier body. Thereby the diameter of the thermal vias is adapted to the respective, applied screen printing technique. The diameter is so predetermined that a sufficient covering of the thermal vias within the opening volume is taking place. For example, a certain minimal filling inside the thermal vias may be required. Further, only a small covering of the margin areas bordering on the thermal vias by screen printing material should occur on the underside of the carrier body because a coating of the connector pads provided on the underside of the carrier body with screen printing material would make worse the thermal transition and thus the removal of the dissipation heat, and because for further method steps in the production of the circuit arrangement, a plane surface of the undersigned of the carrier body is desirable. However, the effort and expense for the screen printing process is rather high because narrow tolerances must be maintained for keeping the protrusions of the screen printing material as small as possible.

SUMMARY OF THE INVENTION

It is the object of the invention to indicate a simple method for producing circuit arrangements having advantageous characteristics regarding the heat dissipation, the reliability, the costs and the manufacturing process.

This object is achieved according to the invention by the combination of the following steps:

a) first applying a first metallization base layer to said carrier body and to said thermal lead-through vias, b) screen printing a viscous material into said thermal lead-through vias thereby closing said thermal lead-through vias to prevent solder of a following soldering step from passing through said thermal lead-through vias, c) removing, following curing of said viscous material, any excess of said viscous material from the underside of the carrier body, and d) second applying at least one further metallization layer to the first metallization base layer outside said viscous material on the inside of said thermal lead-through vias and on the upper side and on the under side of the carrier body.

The screen printing process for the introduction of the screen printing material into the thermal lead-through contacts or thermal vias is performed following the application of a first metallizing layer, preferably copper, forming the base metallization on the carrier body. Specifically, the screen printing is performed prior to the application of at least one further metallizing layer forming the final metallization, whereby the screen printing material is printed over the openings for the thermal lead-through contacts onto the base metallization without maintaining close tolerances. Following the printing and curing of the screen printing material the remainders of the screen printing material protruding on the underside of the carrier body are removed by at least one mechanical cleaning process, whereby on the one hand a plane and on the other hand a clean (shiny) surface is provided which makes possible a better operation for following method steps, for example for the application of further metallizing layers for the end metallization and during the application of an isolation film applied for improving the heat conduction. Particularly, the mechanical cleaning process is performed as a machine brush grinding because this permits a variable control of the material removal by the parameters of the brush grinding machine which is thus well adaptable to the actual operating conditions. Additionally, further mechanical and/or chemical cleaning processes may be optionally performed. Advantageously, cleaning processes which are usually applied in the production process of the circuit arrangement may be employed. After the removal of the protruding screen printing material, at least one further metallizing layer for the formation of the end metallization is applied to the clean and smooth base metallization. For example, a nickel-gold metallization is chemically deposited on the copper layer of the base metallization. Thereafter, an electrically insulating, thermally conducting film is applied to the plane surface of the backside of the carrier body. This film functions as an electrical insulation film and as a heat conducting film. The film fully covers the surface area without any air gaps. That as, the film can be applied with a high mounting certainty and is a direct and thermally full cover over the entire surface of the thermal vias.

During the screen printing process a screen printing film is arranged around the thermal vias and the screen printing material is printed into the openings of the thermal vias from the underside of the carrier body in at least a two-stage printing operation in order to achieve a defined filling volume. Highly viscous thixotropic, paste-like materials which are preferably free of solvents, are used for the screen printing, whereby the screen printing material can be selected with due regard to the material of the carrier body, particularly a solid epoxy material free of solvents is used which has a minimal volume reduction or shrinking during curing. The carrier body is dried and the screen printing material is cured following a testing of the closed openings, for example by an optical inspection with a counterlight or by means of an automated vacuum test which determines the extraneous air component for recognizing possibly present holes. Following the cleaning process with the removal of excess screen printing material and following the application of the metallizing layers for forming the finished metallization, the structural components of the circuit arrangement are soldered to the upper surface of the carrier body, for example by means of a reflow soldering process. Since the thermal vias are closed, contaminations of the underside of the carrier body can be prevented, particularly contaminations caused by a flow of solder from the upper side to the lower side or backside of the carrier body through the thermal vias. The heat transport from the upper side to the underside of the carrier body is not, however, impaired by the screen printing material closing up the thermal vias.

A volume reduction or shrinking of the screen printing material during curing can be avoided by using a screen printing material that is free of a solvent, particularly a solid epoxy so that no bubbles or cracks can occur in the screen printing material. Such cracks or bubbles would impair the reliability of the closure of the thermal vias.

The printing operation of the screen printing material into the thermal vias is performed as often as necessary, at least however, twice in a row, until the desired thickness of the screen printing material in the thermal vias, meaning a certain filling volume in the thermal vias, has been reached and a complete surface area covering of the openings of the thermal vias on the underside of the carrier body with the screen printing material has been achieved.

The present method for producing circuit arrangements is safe and simple. It is an advantage that a solder throughflow through the thermal vias provided in the carrier body is prevented with small costs independently of the configuration of the thermal vias, that is independently of the type of lead-through contacting, for example of the screen printing material. This advantage is achieved even for larger diameters of the thermal vias, for example with a diameter in the range of 0.4 mm to 1.0 mm without impairing the thermal conduction through the thermal vias.

Simultaneously the underside of the carrier body is improved for further method steps during the production of the circuit arrangement, in a simple manner without any additional effort and expense, for example for the application of further metallizing layers or of the insulation film.

BRIEF DESCRIPTION OF THE DRAWINGS

The present method shall be described in the following text with reference to an example embodiment and with reference to the drawing.

Figure 1:
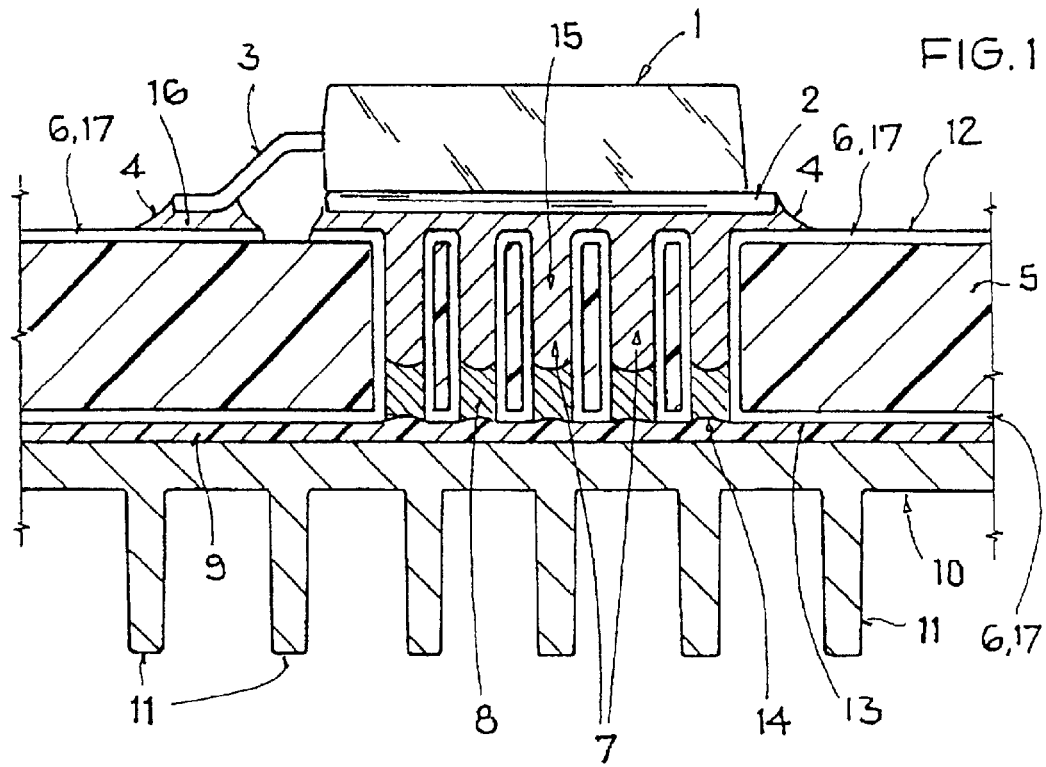
FIG. 1 shows a sectional view of a portion of a circuit arrangement arranged on a carrier body including a power structural component.
Figure 2:
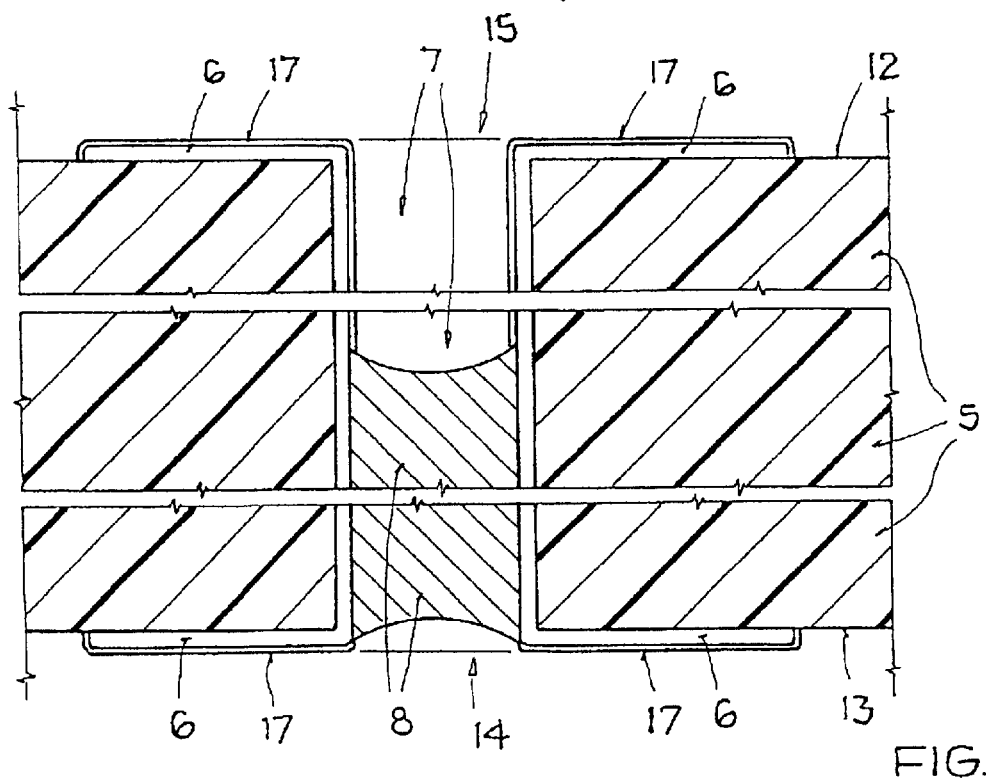
FIG. 2 shows an enlarged scale illustration of a thermal lead-through contact or thermal vias from the upper side to the underside of the carrier body.

DETAILED DESCRIPTION OF A PREFERRED EXAMPLE EMBODIMENT AND OF THE BEST MODE OF THE INVENTION

The circuit arrangement on the upper side 12 of a carrier body 5, which for example is constructed as a printed circuit board, comprises in addition to other active and passive structural components also at least one power component 1 having connector contacts 3 which are to be conductively connected with the contact pad 16 which in turn is connected to the printed circuit structure applied on the carrier body or printed circuit board 5, for example in the form of a copper printed circuit structure for example coated by a nickel-gold (AuNi) coating. The lead-throughs 7, for example in the form of bores also referred to as thermal vias 7, are provided in the printed circuit board 5 for the vertical dissipation of heat which is produced during the operation of the circuit arrangement. The heat to be dissipated is produced particularly by the power components 1. Hence the lead throughs 7 are provided in the area of the power components 1. The walls of the lead-throughs 7 are completely covered over the entire surface area by a base metallization layer 6, for example of copper, to form the thermal through contacts or thermal vias 7. After metallization the bores still have a diameter of, for example 0.5 mm. The power components 1 rest with their cooling flag 2 on the openings 15 on the upper side of the carrier body or printed circuit board 5. The openings 15 lead into the thermal vias 7 so that an efficient heat transfer from the upper side 12 of the printed circuit board 5 to the underside 13 of the printed circuit board 5 is made possible. The heat to be dissipated from the underside 13 of the printed circuit board 5 passes by means of cooling ribs 11 to a cooling system. The cooling ribs 11 are made of cooling sheet metal and are part of a metallic cooling body 10. A thermally conducting, electrically insulating film 9, referred to as insulation film or heat conducting film, is arranged between the underside 13 of the printed circuit board 5 and the cooling sheet metal 10 for electrical insulation.

The circuit components of the circuit arrangement are, for example, to be soldered to the top surface 12 of the printed circuit board or carrier body 5 by means of a reflow soldering process. In order to prevent a throughflow of the solder 4 from the upper side 12, of the printed circuit board 5 to the underside 13 of the board 5 during the soldering of the components on the upper side 12, which is the reflow soldering side or attachment side of the board 5, the thermal vias 7 are closed from the underside 13 of the board 5 prior to the soldering operation by means of a screen printing process.

After the application of the base metallization layer 6, for example of copper having a coating thickness of 70 μm on the surface of the board 5 and in the thermal vias 7 and the structuring thereof the thermal vias 7 are closed by means of screen printing. For this purpose a screen printing film having a diameter of, for example 0.7 mm, is applied around the openings 14 of the thermal vias 7 on the underside 13 of the board 5. For example, the openings 14 have a diameter of 0.5 mm. For this purpose the diameter of the screen printing film does not need to be particularly precisely determined, i.e. the film may have wide tolerances. The screen printing material 8, for example a solid epoxy material, is printed into the openings 14 of the thermal vias 7 on the underside 13 of the printed circuit board 5. A two-step printing operation is employed, also referred to as double-printing or twice wet-on-wet printing. The printing is performed in such a way that a certain filling volume is achieved in the thermal vias 7, that is, a minimal filling level of the screen printing material in the thermal vias 7 at the narrowest point thereof is achieved. For example, the filling level should be at least 15% of the thickness of the printed circuit board or carrier body 5. Further, the printing is performed so that the cured screen printing material 8 does not have any defects, for example, inclusions, air bubbles, pores, etc. The printing is performed so that no screen printing material flows through the lead throughs or bores to avoid contaminating the upper side 12 or component side of the printed circuit board 5. A certain layer costing of the screen printing material 8 results on the surface of the underside 13 of the printed circuit board 5. For example, the layer thickness of the screen printing material 8 is within the range of 30 to 40 μm.

Following the curing of the screen printing material 8 the screen printing material 8 is removed from the surface of the underside 13 of the printed circuit board 5. Particularly, the screen printing material 8 in the area of the openings 14 and around these openings on the underside 13 of the printed circuit board 5 is removed by a chemical and mechanical cleaning process, whereby for example a mechanical brush grinding is used. Such brush grinding is applied during the production of printed circuit boards. This cleaning process is performed, for example for 30 seconds so that the screen printing material 8 is completely removed, except for example for a maximal protrusion of 100 μm of the screen printing material 8 on the surface of the underside 13 of the printed circuit board 5. Thus, the base metallization 6 is prepared for the further method steps without impairing the screen printing material 8 present in the thermal vias 7. Then, the final metallization is applied to the clean base metallization 6 by applying further metallization layers 17 by deposition, for example all accessible areas having a clean base metallization 6 of copper are chemically nickel plated and gold plated. This further metallization layer 17 of chemically deposited nickel-gold has, for example a layer thickness of 3 to 8 μm. Now on the underside of the printed circuit board 5 the electrically insulating and thermally conducting film 9 is applied over the entire surface and flush therewith, for example in the form of a heat conducting film having a thickness of 150 μm.

Although the invention has been described with reference to specific example embodiments, it will be appreciated that it is intended to cover all modifications and equivalents within the scope of the appended claims. It should also be understood that the present disclosure includes all possible combinations of any individual features recited in any of the appended claims.

What is claimed is:

1. A method for producing a circuit arrangement having a carrier body with circuit components secured to an upper side (12) of said carrier body having thermal lead-through vias (7) passing through said carrier body (5) from said upper side (12) to an underside (13) of said carrier body, said method comprising the following steps:

a) first applying a first metallization base layer (6) to a said carrier body (5) and to said thermal lead-through vias (7), b) screen printing a viscous material (8) into said thermal lead-through vias (7) thereby closing said thermal lead-through vias (7) to prevent solder of a following soldering step from passing through said thermal lead-through vias, c) removing, following curing of said viscous material, any excess of said viscous material (8) from said underside (13) of said carrier body (5), and d) second applying at least one further metallization layer (17) to said first metallization base layer (6) outside said viscous material on the inside of said thermal lead-through vias, on the upper side and on the underside of said carrier body.

2. The method of claim 1, wherein said second applying step is performed outside said viscous material (8) covering a portion of said first metallization base layer in said lead-through vias (7).

3. The method of claim 1, wherein said removing step is performed as a mechanical cleaning process.

4. The method of claim 3, wherein said mechanical cleaning process is performed as a mechanical brush grinding step.

5. The method of claim 1, wherein said removing step is performed as a chemical cleaning process.

6. The method of claim 2, further comprising, following said second applying step, a step of attaching said circuit components (1) to said upper side (12) by a reflow soldering process.

7. The method of claim 1, further comprising, following said second applying step, a step of applying a thermally conducting, electrically insulating film (9) to said underside (13) of said carrier body.

8. The method of claim 7, further comprising connecting said thermally conducting, electrically insulating film to a cooling body.

9. The method of claim 1, further comprising using as said viscous material a solid epoxy material which is sufficiently viscous for performing said screen printing step.

10. The method of claim 1, further comprising performing said step of screen printing on said underside (13) of said carrier body.

11. The method of claim 1, wherein said second applying step is performed by applying a nickel-gold coating to said first metallization base layer outside said viscous material, to form said second metallization layer (17).

* * * * *

UNITED STATES PATENT AND TRADEMARK OFFICE
CERTIFICATE OF CORRECTION

PATENT NO. : 6,820,798 B1
DATED : November 23, 2004
INVENTOR(S) : Heinz et al.

It is certified that error appears in the above-identified patent and that said Letters Patent is hereby corrected as shown below:

Title page
Item [57], ABSTRACT, replace lines 1 to 13 to read:

-- The aim of the invention is to simplify and improve the production method for circuit arrangements that are mounted on a support element or carrier body (5). The support element (5) has thermal lead-through contacts (7) which are at least partially closed by a screen printing process. To this end, the screen printing process is carried out after the application of a first metallization layer (6) to the support element (5), whereby the first layer forms the base metallization. Residue of the screen printing material (8) protruding on the underside (13) of the support element (5) is removed once the screen printing material (8) has been cured. The removal is performed by using at least a mechanical cleaning process and/or a chemical cleaning process. --.

Column 5,
Line 28, after "layer", replace "costing" by -- coating --.

Column 6,
Line 39, after "claim", replace "2," by -- 1, --.

Signed and Sealed this

Twenty-ninth Day of March, 2005

JON W. DUDAS
*Director of the United States Patent and Trademark Office*